United States Patent [19]

Kammiller

[11] Patent Number: 5,654,661

[45] Date of Patent: Aug. 5, 1997

[54] DRIVE CIRCUIT FOR SCR DEVICE

[75] Inventor: Neil A. Kammiller, Lorain, Ohio

[73] Assignee: Reltec Corporation, Lorain, Ohio

[21] Appl. No.: 567,299

[22] Filed: Dec. 5, 1995

[51] Int. Cl.⁶ ................................................ H03K 17/72
[52] U.S. Cl. ........................ 327/438; 327/447; 327/448; 327/451
[58] Field of Search ........................... 327/79, 447, 451, 327/453, 468, 582, 438, 448

[56] References Cited

U.S. PATENT DOCUMENTS

| | | | |
|---|---|---|---|
| 3,558,979 | 1/1971 | Lorenz | 317/16 |
| 3,646,578 | 2/1972 | Gregory | 307/252 J |
| 3,746,964 | 7/1973 | Guyton | 321/5 |
| 3,818,272 | 6/1974 | Rich | 317/20 |
| 4,091,434 | 5/1978 | Suzuki et al. | 361/100 |
| 4,234,917 | 11/1980 | Suzuki et al. | 363/160 |
| 4,346,432 | 8/1982 | Gurr | 363/129 |
| 4,484,244 | 11/1984 | Avery | 361/54 |
| 4,581,542 | 4/1986 | Steigerwald | 307/252 |
| 5,420,780 | 5/1995 | Bernstein et al. | 363/89 |

Primary Examiner—Timothy P. Callahan
Assistant Examiner—Jeffrey Zweizig
Attorney, Agent, or Firm—Fay, Sharpe, Beall, Fagan, Minnich & McKee

[57] ABSTRACT

An SCR control circuit which drives the SCR between conduction and non-conduction states in accordance with values sensed by a polarity sensing circuit. The control circuit generating a signal for the gate which is of a constant value, at different temperatures.

19 Claims, 3 Drawing Sheets

DRIVE CIRCUIT FOR SCR DEVICE

BACKGROUND OF THE INVENTION

The present invention relates to SCR control circuits. The invention finds particular application in controlling the operation of an SCR in an inrush clamp circuit and will be described with particular reference thereto. It will be appreciated, however, that the invention has broader applications and may be advantageously employed in other environments and applications.

SCR's are found in a wide variety of control devices. One particular implementation uses SCRs in an inrush clamp circuit for controlling inrush current. In such a clamp circuit, an SCR is turned on after a capacitor has been charged up to a predetermined level. Current is initially provided through a resistive element to limit current flow to a desired value during a capacitor charging period. Once the capacitor has been charged and larger currents are to be supplied, the SCR is triggered at its gate to an on state thereby allowing larger currents to be supplied. Through this configuration the inrush current is limited during the charging period and a path for larger currents is provided following the charging period. This is accomplished, for example, by placing the SCR in parallel with a charging resistor. After the capacitor has been charged to the predetermined value the gate of the SCR is activated, turning on the SCR which in turn essentially removes the resistor from the circuit allowing larger currents to flow through the SCR.

In an inrush clamp circuit which uses an SCR, one known type of circuit triggers the SCR and maintains it in a conductive state throughout the remaining operation of the circuit. Such a circuit wastes power by supplying a signal to the gate even during periods when the relevant portion of the circuit is not active. Another drawback is the risk of having a positive gate voltage when the anode portion of the SCR goes negative. This is undesirable as it increases the chance of leakage current during the negative going period. Further, since SCRs are temperature dependent devices, when the temperature is low more current will be needed to trigger the SCR gate and when the temperature rises less current will be needed. Thus circuits which deliver a constant value of current to the SCR gate, irrespective of temperature changes, will at times provide excessive current thereby wasting energy, and at other times provide less than needed current thereby risking unstable operation of the circuit.

It has, therefore, been deemed desirable to construct a SCR control circuit which takes into account the characteristics of an SCR where the signal supplied to the gate is current controlled, the gate current is temperature dependent, and where the control signal to the gate is provided in an on/off switching manner.

Taking into consideration the characteristics of the SCR, the subject invention provides an SCR control circuit which overcomes the deficiencies of prior devices. The control circuit of the subject invention runs on low voltage for improved efficiency, saves energy/power by delivering a current signal to the gate only when it is useful, and avoids supplying excessive or insufficient current to the gate by matching general trends of the requirements of the SCR, such as temperature dependent requirements. While the current supplied to the gate is temperature dependent, it is otherwise constant and is not affected by changes in the voltage supply. The circuit further improves efficiency and maintains an undistorted waveform by using biased polarity sensing to anticipate when the signal for the gate will be necessary and supplying the gate signal before an active time period.

SUMMARY OF THE INVENTION

The present invention contemplates a new and improved SCR control circuit which overcomes all of the above noted problems and others, includes polarity sensing circuitry which senses the polarity applied to the SCR. Further, a switching current source connected to the gate of the SCR supplies and removes a temperature dependent but otherwise constant current to and from the gate in an appropriate manner.

In a more limited aspect of the subject invention, the polarity sensing circuitry of the SCR is configured to adjust current flow within the circuit such that at an appropriate point in an AC signal, the current signal applied to the gate of the SCR is removed during a period corresponding to the time when the SCR is not active.

According to another aspect of the subject invention, the SCR control circuit is used as a drive circuit for an SCR which is part of an inrush clamp circuit, wherein charging current flows through a resistance. Thereafter, the parallelly supplied SCR is turned on at its gate such that the resistance is removed from the circuit and current is made to flow through the SCR.

In still another aspect of the subject invention, the signal is supplied to the gate of the SCR such that there is a commutation overlap at a zero crossing of the voltage supply to avoid signal distortion.

A principal advantage of the subject invention is the provision of a SCR control circuit which is highly efficient, runs on a low voltage, and supplies the SCR gate only at desired time periods.

Another advantage of the invention resides in providing a current to the gate which is temperature dependent to compensate for gate temperature sensitivity, but which is otherwise a constant current.

Still another advantage of the subject invention is providing reverse voltage to the gate during a time when negative voltage exists on the anode of the SCR.

Still yet another advantage of the subject invention is commutation overlap at zero crossing of the line supply to avoid distortions in generated signals.

Still other advantages and benefits of the invention will become apparent to those skilled in the art upon a reading and understanding of the following detailed description.

BRIEF DESCRIPTION OF THE DRAWINGS

The invention may take form in certain parts and arrangements of parts, a preferred embodiment of which will be described in detail in this specification and illustrated in the accompanying drawings which form a part hereof and wherein.

DETAILED DESCRIPTION OF THE PREFERRED EMBODIMENT

Figure 1:
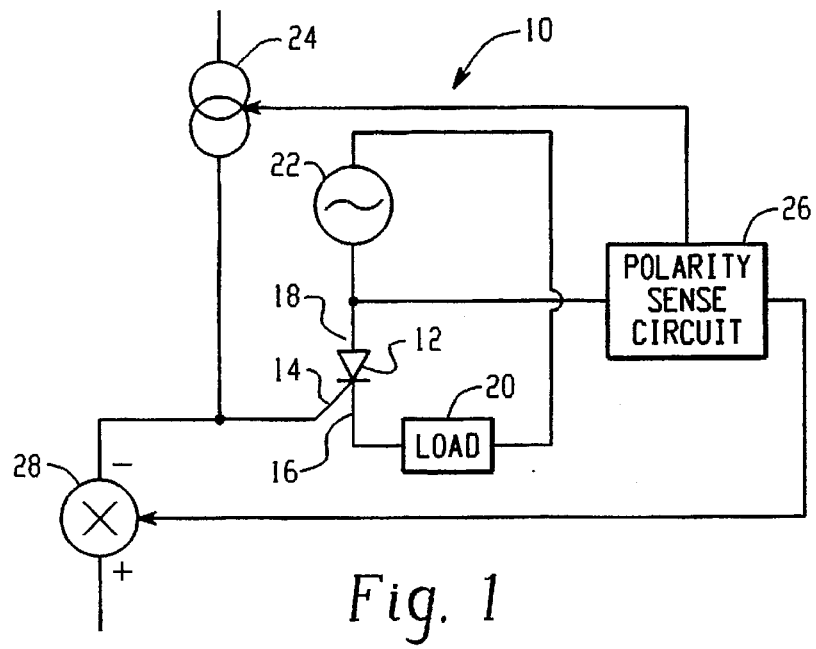
FIG. 1 is a block diagram of the SCR control circuit according to the subject invention.

Referring now to the drawings wherein the showings are for the purposes of illustrating a preferred embodiment of the invention only and not for purposes of limiting same. FIG. 1 is a block diagram of an SCR control circuit 10 used to control the operation of SCR 12. SCR 12 is a four-layer device used as a silicon rectifier, where conduction is controlled by a gate electrode 14. When forward voltage is applied between cathode 16 and anode 18, in series with an external load 20, no appreciable load current can flow until a barrier voltage at the gate-cathode junction is overcome, which is an internal reverse bias of about 0.7 volts.

Forward voltage, from AC source 22, is applied for one-half cycle of an AC input, between the cathode 16 and anode 18. However, the cathode-anode voltage is distributed over four layers, reducing the amount of forward voltage at the gate 14, but with a high enough forward voltage applied the SCR 12 can conduct. This value is the forward break-over voltage.

When the SCR is conducting, this is the on state. The SCR 12 has very low resistance during this state, serving as a silicon diode rectifier. In the off state, the SCR is at a very high resistance, and is practically an open circuit. The break-over voltage to turn on the SCR 12 is controlled by the gate 14. A small positive voltage at the gate 14 neutralizes the internal reverse bias of the gate allowing conduction in the main circuit for the load 20.

In normal operation, the forward voltage from the anode circuit is below the break-over voltage but the SCR 12 is switched on by the gate 14. Once the SCR is turned on by the gate signal, the load current is independent of the gate voltage or current. The SCR 12 remains on, conducting at a holding current, until the main circuit reduces the forward voltage below the value required to sustain conduction. When the SCR is off, the gate signal can be again applied to reactivate the SCR for conduction.

In FIG. 1 the switching current source 24 is used to apply a signal to gate 14 placing the SCR 12 in an on conduction state. During this state current flows through SCR 12 to load 20. Polarity sense circuit 26 is connected to the anode 18 of SCR 12. The negative going portion of the signal from AC signal source 22 is sensed by polarity sense circuit 26 which supplies a feedback signal to switching current source 24. Using this signal, switching current source 24 removes the signal supplied to gate 14. Similarly, polarity sense circuit 26 also supplies a signal to switched reverse bias voltage source 28. During the negative going portion of the AC signal, when current from the switching current source 24 is removed from gate 14, a slightly negative bias voltage from switched reverse bias voltage source 28 is applied to gate 14.

The circuit of FIG. 1 runs on a low voltage to increase circuit efficiency. The switching current source 24 supplies a constant current which is not changed due to supply voltage variations, but is temperature dependent to compensate for gate temperature sensitivity. Circuit 10 further provides a reverse voltage for gate 14 during a reverse anode 18 voltage time period and provides commutation overlap at a zero voltage crossing of the AC signal to avoid line current distortions.

Figure 2:
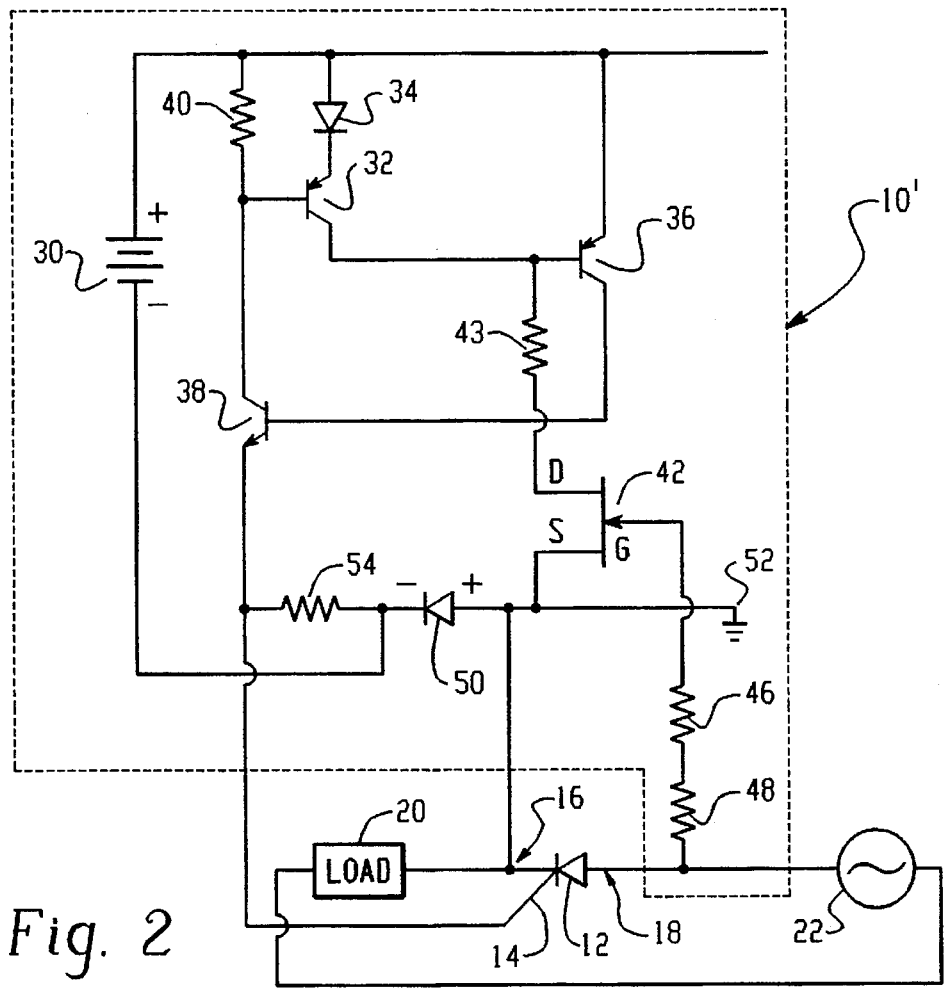
FIG. 2 is a more detailed schematic view of the SCR control circuit according to the subject invention.

Turning attention to the more detailed circuit of FIG. 2, the transistors and elements of circuit 10' are arranged in a circuit which provide the benefits discussed in connection with FIG. 1. Particularly, this circuit includes a temperature dependent but otherwise constant current to gate 14 during the positive going portion of the AC input signal, provided by AC source 22. Voltage source, $V_{cc}$, 30 provides the power to operate control circuit 10'. While FIG. 2 shows $V_{cc}$ 30 as a battery, it may be implemented in a variety of known manners including a rectified AC signal.

With specific attention to the configuration of this circuit, a first or comparator bipolar PNP transistor 32 has its emitter connected to the cathode of a diode 34 which is in turn connected to positive $V_{cc}$ 30 through its anode. The collector of transistor 32 is input to the base of a second bipolar PNP transistor 36. Second transistor 36 is connected to positive $V_{cc}$ through its emitter, with its collector connected to the base of a third bipolar PNP transistor 38. The emitter of third transistor 38 is connected to gate 14 of SCR 12, and the collector of transistor 38 is connected to the base of the first transistor 32 and to one end of current sense resistor 40 whose other end is connected to positive $v_{cc}$ 30.

A fourth transistor 42, which is a JFET and which is normally in an on state has its drain connected through resistor 43 to the base of the second transistor 36 and to the collector of the first transistor 32. The source of fourth JFET transistor 42 is connected to the cathode 16 of SCR 12, while the gate of JFET transistor 42 is connected through resistances 46 and 48 to anode 18 of SCR 12. Further, diode 50 has its anode connected to circuit common 52 which is also connected to the source of JFET 42 and the cathode 16 of SCR 12. The cathode of diode 50 is connected to one end of resistor 54 which is also connected to the negative side of $V_{cc}$ 30. The other end of resistor 54 is connected to both the emitter of transistor 38 and to gate 14 of SCR 12.

First transistor 32 is a current sense transistor used as a comparator that matches its operation in conformance with the voltage at current sense resistor 40, which acts to monitor the current supplied to gate 14. Current flowing through resistor 40 develops a voltage, when this voltage is of a large enough magnitude transistor 32 is turned on. When transistor 32 is not on, the current to gate 14 is below the programmed value and current available for the base of transistor 38 is at its maximum. First transistor 32 operates with approximately a volt on its base, which includes two diode drops, one from each of diode 34 and the internal diode drop at its own base-emitter junction. These two series connected diodes are used to form a reference voltage for circuit 10'.

As noted above, first transistor 32 operates as a current comparator, the collector from first transistor 32 controls the current into the base of second transistor 36. Transistor 36 has a current source delivered from the drain of the JFET transistor 42, whose source in turn is connected to circuit common 52. By this connection current is provided from the drain of transistor 42 to the base of transistor 36 on an intermittent basis.

During the operation of the control circuit 10', the current comparator or first transistor 32 takes current from the base of second transistor 36 in accordance with maintaining a constant voltage, at a given temperature, across resistor 40. This constant voltage is determined by the voltage drops across the diode 34 and the base-emitter junction of transistor 32. The operation of the control circuit 10' acts to maintain this voltage at a level that allows the current through current sense resistor 40 to be maintained constant, but temperature dependent.

Current through resistor 40 is maintained as temperature dependent because the voltages of the diode 34 and the base-emitter junction of transistor 32 are temperature dependent. Particularly, at low temperatures these voltages will rise to over a volt, at a higher temperature the voltages will drop to below a volt. This temperature dependency operates in conjunction with the temperature dependent nature of SCR 12, as it has a similar characteristic of requiring less current at higher temperatures and more current at lower temperatures to be placed in a conductive state.

The current that is being controlled, and developed across resistor 40 is passed to the collector of third transistor 38 which supplies this current through its emitter to the gate 14 of SCR 12, thereby placing SCR 12 in an on conduction state. Third transistor 38 receives its operational current from the collector of second transistor 36.

From the above described configuration, it can be seen that the subject circuit operates in a loop. Particularly, the base of third transistor 38 receives its operational current from the collector of second transistor 36, second transistor 36 receives an operational base current from the drain of fourth transistor 42, and first transistor 32 takes base current from the base of second transistor 36 in accordance with maintaining the voltage across current sense resistor 40, in order to produce a constant output current at a given temperature. One portion of the loop includes operations by the comparator transistor 32, the other portions include second transistor 36 with a gain control on a resistive element (not shown) and a base current supplied from fourth transistor 42, which is turned on and off at approximately the zero-crossing of the AC signal supplied by AC supply 22.

The gate of fourth transistor 42 sees two current limiting resistors 46 and 48. These resistors could be supplied as a single resistor in other embodiments of the control circuit 10', however, in the present implementation one resistor would be difficult to use as it would be unable to withstand the voltage of the system which could reach 400 volts. Nevertheless, whether one resistance or multiple resistances are used, the line including the resistance is connected to the anode of SCR 12. Such connection is used to sense voltage on the anode of the SCR to determine its polarity. If the polarity at this location of the SCR is negative to a sufficient degree, the normally on JFET transistor 42 is placed in an off state, whereby the current it was supplying to the base of second transistor 36 is removed. With the current from the base of second transistor 36 turned off the current from the collector of second transistor 36 is no longer supplied to the base of third transistor 38. Therefore, third transistor 38 is turned off and the signal from the emitter of third transistor 38 is removed from gate 14. This operates to place SCR 12 in a non-conducting or off state.

A negative polarity is sensed on the anode of SCR 12 when an AC signal supplied from AC signal source 22 enters a negative portion. Therefore, transistor 42 is turning on and off at approximately the zero-voltage crossing of the AC line supply, from AC supply 22.

An aspect of the subject invention is, however, that there is some commutation overlap at the zero-voltage crossing for turning off and on fourth transistor 42. Because transistor 42 is a JFET, it will be turned off when there is a substantial negative value placed at its gate, for example approximately 6 to 10 volts in the subject embodiment. Therefore, fourth transistor 42 will continue to supply current to the base of second transistor 36 until there is a substantial negative signal at the gate of fourth transistor 42, and as noted above, this point is beyond the zero-voltage crossing of the AC signal. Therefore, the anode of SCR 12 will have gone slightly negative before fourth transistor 42 is turned off. Thus, when there are zero volts on the anode the system will still be in on state supplying a signal to gate 14.

Requiring some negative voltage to be placed on the anode of the SCR 12 before the system can be turned off means there is some commutation overlap during the zero-voltage crossing time period. This is a beneficial aspect of the subject invention as it ensures that there will be no distortions, such as notching, of the waveform produced by the overall circuit being controlled. Further, when the SCR 12 is to be activated the control circuit generates a signal for the gate 14 slightly before the time the SCR is to start conducting. In other words, there is an anticipation, about 1 millisecond in the present embodiment, of when it will be necessary for the SCR 12 to be turned on. By this operation a gate signal will be present at the gate when the SCR again becomes forward biased. This eliminates the possibility of distortion of the zero-voltage crossing during the activation of the SCR.

If instead of the above operation control circuit 10' were constructed to give current to gate 14 exactly at the time when the current starts to build, the zero-voltage crossing could be missed, then a part of the time period when the current through the SCR 12 was intended to flow will be missed since the gate signal would be late in placing the SCR into a conductive state. This can in turn result in the undesirable situation of distortion in the waveforms of the overall circuit.

With further attention to the off time of the SCR, it is noted that a desirable scenario for an SCR is to have a small amount of reverse bias on its gate when the anode voltage is negative. Therefore, when the circuit is operating to place SCR 12 in a non-conductive state, the cathode of the SCR 12 is essentially pulled to circuit common 52 of the drive circuit 10'. This acts to place a small negative bias on gate 14 of the SCR when the SCR is in the off state. This bias is applied from the cathode of diode 50, through resistor 54. When diode 50 is forward biased a slight negative voltage is on its cathode which is connected to the return of gate 14 which is resistor 54. Resistor 54 is the gate resistor and is connected to the gate 14 at all times and provides the negative bias voltage to gate 14, when third transistor 38 is in an off state. When third transistor 38 is off, gate 14 sees the voltage produced on resistor 54 which is slightly negative. Due to the arrangement of control circuit 10', diode 50 produces a small negative voltage in relationship to circuit common 52.

Figure 3:
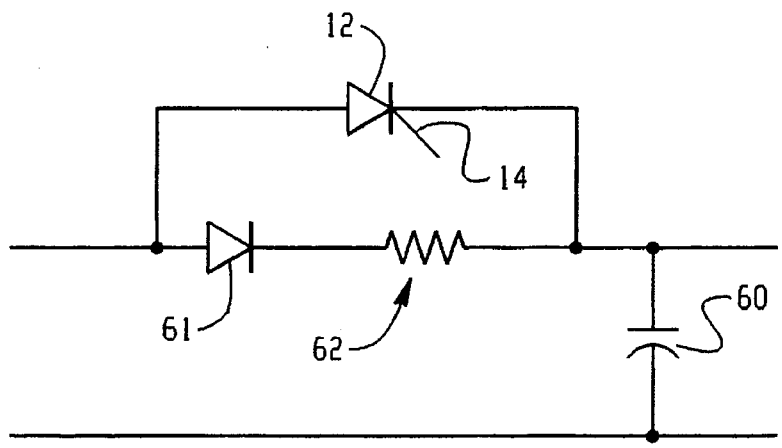
FIG. 3 illustrates a simplified view of a inrush resistor clamp for a single SCR.

The above described SCR control circuit 10' may be implemented in a variety of environments including a circuit for inrush resistor clamping. It is desirable in such a situation to provide a controlled input to a capacitor to be charged. However, once the capacitor has been charged to a predetermined level it may then be useful to allow larger currents to be carried. For example, as illustrated in FIG. 3, to charge capacitor 60 current is initially passed through a diode 61 and a limiting resistor 62 combination. During the charging time period current through the diode 61 resistor 62 combination acts to charge up capacitor 60. Once a predetermined level of charge is achieved, larger currents may be used. In this situation, the SCR 12 is moved to an on conducting state by providing a signal of sufficient size on its gate 14. Once this occurs, the SCR 12 essentially removes the diode 61 resistor 62 combination from the circuit, thereby allowing the flow of larger currents. If SCR 12 is placed in a conducting state when capacitor 60 is not fully charged, large inrush currents can act to damage the circuit.

A point of control circuit 10' is to control the on/off conduction of the SCR 12 to avoid the damaging inrush currents. It is again to be appreciated that while applicants are now discussing the subject circuit in connection with inrush limiting, the SCR control circuit 10' may be used in other environments.

Figure 4:
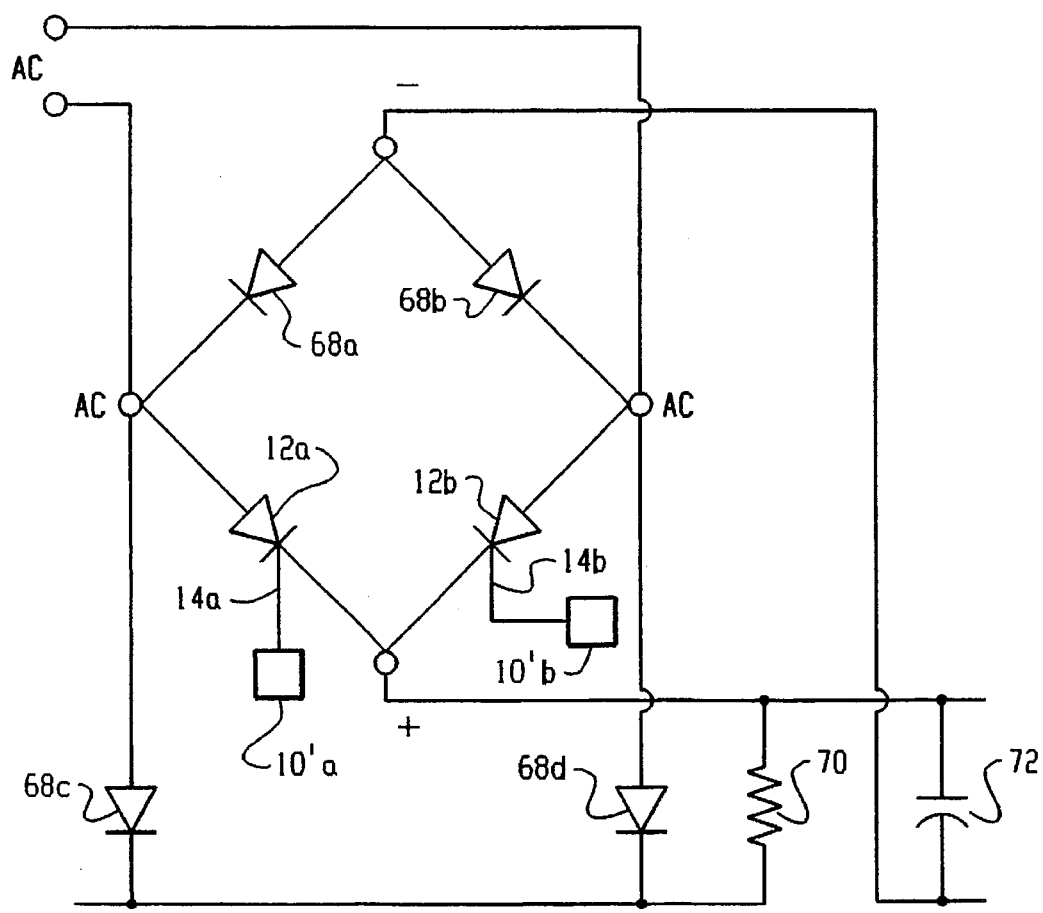
FIG. 4 illustrates a schematic of a bridge network SCR inrush resistor clamp circuit for charging a single capacitor.

A particular implementation of the control circuit 10' of the subject invention is illustrated in FIG. 4. This FIGURE sets forth a full bridge control circuit having four diodes 68a–68d, a limiting resistor 70 and two SCRs 12a, 12b, current in the circuit being used to charge capacitor 72. During an initial charging time period, diodes 68a–68b charge capacitor 72 through resistor 70. Once capacitor 72 has reached its predetermined charge, and larger currents are sought, SCRs 12a, 12b are alternatively placed in on/off states such that the resistive element 70 is bypassed, allowing transmission of current larger than those possible through resistive element 70. The on/off conduction of the SCRs 12a, 12b are controlled by control circuits 10'a, 10'b disclosed in the previous discussion.

Control circuits 10'a, 10'b provide a manner of obtaining functions that are desirable in driving the gates of SCRs. These functions include providing a constant temperature dependent current, i.e. a current which is constant regardless of supply voltages, gate voltages, device selections, etc. at a given temperature. A further function achieved by the subject invention is the ability to turn SCRs on and off at every half cycle and alternatively such as in FIG. 4 between at least two SCRs. There is also provision by the control circuits 10'a, 10'b of a commutation overlap so that the SCRs 12a, 12b will be in an on state at near zero-voltage crossover but not exactly at the zero crossover, thereby avoiding distortions of the circuit signal. The control circuits 10'a, 10'b are also immune to certain line transients and will also run on low voltages, i.e. approximately 4 ½ volts $V_{cc}$ in the present embodiment.

Figure 5:
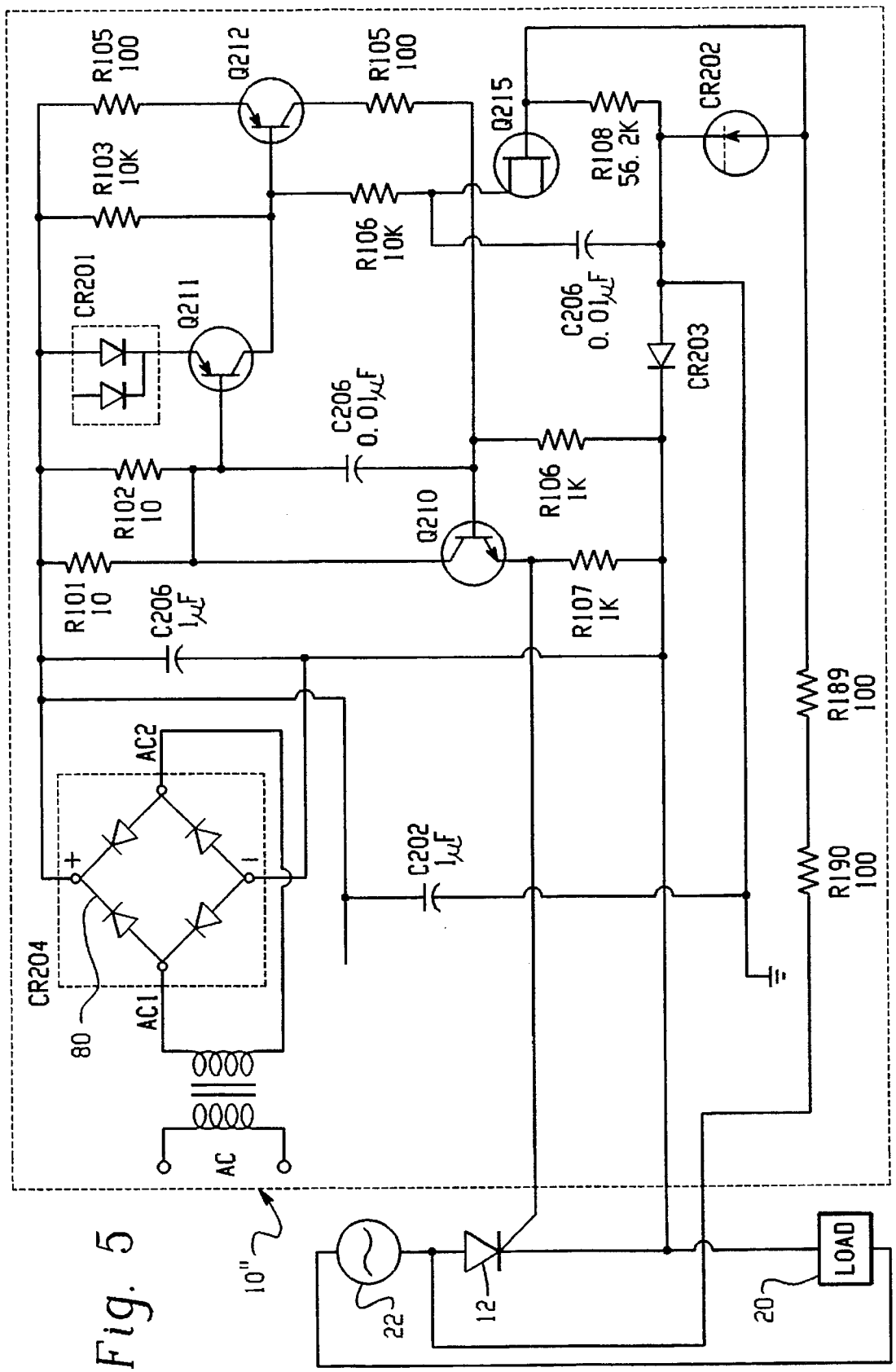
FIG. 5 is a more detailed schematic of a control circuit according to the subject invention.

FIG. 5 illustrates a more detailed schematic of the subject control circuit. The circuit 10" in FIG. 5 operates similar to that shown in FIG. 4. However, FIG. 5 shows two sense resistors R101 and R102, which may be used when a double power supply unit is being controlled. The current through gate 14 is monitored by R101 and R102. When a single power unit is being controlled a single resistor such as shown in FIG. 4 may be used. Current flowing through resistors R101 and R102 develop voltage across these resistors. When this voltage is of a great enough magnitude it will operate to turn on transistor Q211. When Q211 is not on, then the current is below a programmed value. The programmed value is set by appropriate selection of components. When Q211 is not on, the current available for the base of Q210 is at its maximum. This current for the base of Q210 flows through a current path from R104 through transistor Q212 on through resistor R105 into the base of Q210. When Q211 is moved into an on state it acts to reduce the current to Q210 dependent upon a comparison with resistor elements R101 and R102. When Q211 is turned on it acts to pull down the base of Q212 to modulate transient current. The diode bridge 80 in FIG. 5 is an auxiliary supply bridge to supply the circuit and is equivalent to $V_{cc}$ 30 of FIG. 2. The additional components found in FIG. 5 simply provide greater detail as to actual circuit implementation.

The invention has been described with reference to the preferred embodiment. Obviously modifications and alterations will occur to others upon a reading and understanding of this specification. It is intended to include all such modifications and alterations insofar as they come within the scope of the appended claims or the equivalents thereof.

Having thus described the invention, it is now claimed:

1. A drive circuit for controlling operation of an SCR comprising:

a switching power source connected to a gate of the SCR, which delivers a signal to the gate at predetermined time periods;

a switching reverse bias voltage source connected to the gate of the SCR; and a polarity sensing circuit connected to an anode of the SCR, to the switching power source and to the switching reverse bias voltage source, to sense when the anode of the SCR is in one of a positive and negative state, wherein the switching power source delivers a signal to the gate sufficient to place the SCR in a conduction state while the polarity sensing circuit senses a positive voltage on the anode and wherein a reverse bias voltage for the gate of the SCR is applied when the polarity sensing circuit senses a reverse anode voltage.

2. The drive circuit according to claim 1 wherein the switching power source is a temperature dependent current source which generates a current whose value is altered dependent upon ambient temperature, and whose current is supplied to the gate of the SCR.

3. The drive circuit according to claim 2 wherein the current from the temperature dependent current source, supplied to the gate of the SCR, whose value changes based on the ambient temperature, is otherwise a constant current.

4. The drive circuit according to claim 3 wherein the current supplied to the gate of the SCR remains constant regardless of changes in supply voltages, gate voltages and gate parameters.

5. The drive circuit according to claim 2 wherein the temperature dependent current source includes a first transistor with its emitter connected to a cathode of a diode which has its anode connected to a positive voltage source; and a resistor with one end connected to both the base of the first transistor and to the collector of another transistor, whose emitter is tied to the gate of the SCR.

6. The drive circuit according to claim 5 wherein the first transistor is a bipolar PNP transistor and the transistor with its emitter connected to the gate of the SCR is a bipolar NPN transistor.

7. The drive circuit according to claim 1 wherein the polarity sensing circuit includes a JFET transistor with its gate connected to the anode of the SCR.

8. The drive circuit according to claim 1 wherein the SCR is maintained in an on state for ½ of an AC input.

9. The drive circuit according to claim 2 wherein the temperature dependent current source is configured to generally follow the signal requirements of the SCR which vary in accordance with temperature changes.

10. The drive circuit according to claim 5 wherein the first transistor operates as a current comparator.

11. A drive circuit for controlling operation of an SCR comprising:

a supply;

a current sensor resistor connected at a first end to a positive supply voltage, $V_{cc}$;

a diode having an anode connected to positive $V_{cc}$;

a first transistor whose base is connected to a second end of the current sensor resistor and whose emitter is connected to a cathode of the diode;

a second transistor having its base connected to the collector of the first transistor, and its emitter connected to positive $V_{cc}$;

a third transistor whose base is connected to the collector of the second transistor, whose collector is connected to the base of the first transistor, and whose emitter is connected to the gate of the SCR;

a fourth transistor having its drain connected to the base of the second transistor, whose source is connected to the cathode of the SCR, and whose gate is connected through a resistance, to the anode of the SCR;

a second diode whose anode is connected to the source of the fourth transistor, and whose cathode is connected to negative $V_{cc}$; and a second resistance whose first end is connected to the cathode of the second diode and to the negative $V_{cc}$, and whose second end is connected to the emitter of the third transistor and the gate of the SCR.

12. A drive circuit for controlling operation of an SCR used in an inrush clamp circuit comprising:

a switching power source connected to a gate of the SCR, which delivers a signal to the gate at predetermined time periods;

a switching reverse bias voltage source connected to the gate of the SCR; and a polarity sensing circuit connected to an anode of the SCR, to the switching power source and to the switching reverse bias voltage source, to sense when the anode of the SCR is in one of a positive and negative state, wherein the switching power source delivers a signal to the gate sufficient to place the SCR in a conduction state while the polarity sensing circuit senses a positive voltage on the anode and wherein a reverse bias voltage for the gate of the SCR is applied when the polarity sensing circuit senses a reverse anode voltage.

13. The drive circuit according to claim 12 wherein the switching power source is a temperature dependent current source which generates a current whose value is altered dependent upon ambient temperature, and whose current is supplied to the gate of the SCR.

14. The drive circuit according to claim 13 wherein the current from the temperature dependent current source, whose value changes based on the ambient temperature, is otherwise a constant current.

15. The drive circuit according to claim 14 wherein the current supplied to the gate of the SCR remains constant regardless of changes in supply voltages, gate voltages and gate parameters.

16. The drive circuit according to claim 12 wherein the temperature dependent current source includes a first transistor with its emitter connected to a cathode of a diode which has its anode connected to a positive voltage source; and a resistor with one end connected to both the base of the first transistor and to the collector of another transistor, whose emitter is tied to the gate of the SCR.

17. The drive circuit according to claim 16 wherein the first transistor is a bipolar PNP transistor and the transistor with its emitter connected to the gate of the SCR is a bipolar NPN transistor.

18. The drive circuit according to claim 12 wherein the SCR is maintained in an on state for ½ of an AC input.

19. The drive circuit according to claim 16 wherein the first transistor operates as a current comparator.

* * * * *